United States Patent [19]
Olsson
[11] 4,252,389
[45] Feb. 24, 1981

[54] ZERO INSERTION FORCE CONNECTOR HAVING INTEGRAL UNLOADING MEANS

[75] Inventor: Billy E. Olsson, New Cumberland, Pa.
[73] Assignee: AMP Incorporated, Harrisburg, Pa.

[21] Appl. No.: 24,356
[22] Filed: Mar. 27, 1979

Related U.S. Application Data

[63] Continuation-in-part of Ser. No. 953,677, Oct. 23, 1978, Pat. No. 4,181,386, which is a continuation-in-part of Ser. No. 918,139, Jun. 22, 1978, Pat. No. 4,172,626.

[51] Int. Cl.³ ........ H05K 1/12
[52] U.S. Cl. ........ 339/17 F; 339/74 R
[58] Field of Search ........ 339/17 F, 74 R, 75 MP, 339/176 MF

[56] References Cited

U.S. PATENT DOCUMENTS

| | | | |
|---|---|---|---|
| 3,629,787 | 12/1971 | Wilson | 339/17 F |
| 3,851,294 | 11/1974 | Palazzetti et al. | 339/17 F |
| 3,989,336 | 11/1976 | Rizzio, Jr. et al. | 339/74 R |
| 4,060,295 | 11/1977 | Tomkiewicz | 339/17 F |

FOREIGN PATENT DOCUMENTS

| | | | |
|---|---|---|---|
| 2241888 | 3/1975 | France | 339/176 MF |

*Primary Examiner*—Neil Abrams
*Attorney, Agent, or Firm*—Frederick W. Raring

[57] ABSTRACT

Zero insertion force connecting means for connecting spaced-apart conductors on a film to spaced-apart conductors on a circuit board comprises a one-piece stamped and formed spring clip. The clip has a rectangular clip bar which is spaced from the circuit board and has cantilever springs which extend from one edge of the clip bar. The springs are reversely bent so that they extend to the circuit board conductors and then from the circuit board conductors past the other side edge of the clip bar. An integral lifting bar is provided for lifting the springs away from the circuit board thereby to permit insertion of the film and positioning of the film conductors beneath the springs and against the circuit board conductors.

7 Claims, 6 Drawing Figures

ZERO INSERTION FORCE CONNECTOR HAVING INTEGRAL UNLOADING MEANS

This application is a Continuation-in-part of Application Ser. No. 953,677 filed Oct. 23, 1978, now U.S. Pat. No. 4,181,386. U.S. Pat. No. 4,181,386 in turn is a Continuation-in-part of Application Ser. No. 918,139 filed June 22, 1978 and now U.S. Pat. No. 4,172,626.

FIELD OF THE INVENTION

This invention relates to electrical connector clips intended for mounting on a circuit board in straddling relationship to conductors on the circuit board and having springs for urging conductors in a cable or on a film against the circuit board conductors.

BACKGROUND OF THE INVENTION

U.S. Pat. No. 4,181,386 discloses and claims an electrical connector clip which is intended for mounting on a panel-like member such as a circuit board and which serves to connect connectors on a film or in a cable to conductors on the circuit board. The connector clip comprises a rectangular clip bar having spaced-apart cantilever springs extending from one of its side edges. These springs are reversely bent adjacent to the one side edge and extend from the bent portions diagonally towards the conductors on the surface of the circuit board. Each spring is resiliently biased against a conductor when the clip is mounted on the circuit board so that a cable or film can be inserted between the springs and the surface of the circuit board and the springs will press the film conductors against the circuit board conductors. The connector clip shown in the above identified application is a zero insertion force device in that a specialized tool is required to raise the springs away from the surface of the circuit board when the cable or film is inserted or withdrawn from beneath the springs.

The zero insertion force feature of the clip shown in the above identified application is highly desirable for the reason that the springs can be designed to produce high contact forces and the conductors on the film are not damaged when the film is inserted beneath the springs notwithstanding the high contact forces. The requirement of a specialized tool to raise the springs from the surface of the circuit board is desirable under many circumstances for the reason that the need for such a tool discourages unauthorized tampering with the circuitry on the circuit board by unqualified persons. However, there are other circumstances where there is no requirement for a specialized tool and the requirement may in fact be undesirable. The present invention is directed to the achievement of a connecting means and a connector clip, of a general class described in U.S. Pat. No. 4,181,386, which has integral unloading means for the springs and which does not therefore require a specialized tool.

A connector clip in accordance with the present invention comprises a one-piece stamped and formed member having a clip bar and having cantilever springs extending from one side edge of the clip bar. The springs are reversely bent and have spring arm portions which extend towards, and are resiliently biased against, the circuit board conductors when the clip is mounted on the circuit board, the contact areas being beneath the clip bar. Each spring has an end portion which extends from the contact area diagonally away from the surface of the circuit board and beyond the other side edge of the clip bar. A lifting bar is provided at the ends of the springs so that the springs can be raised from the surface of the circuit board by merely moving the lifting bar away from the surface of the circuit board.

PRACTICE OF THE INVENTION

Figure 1:
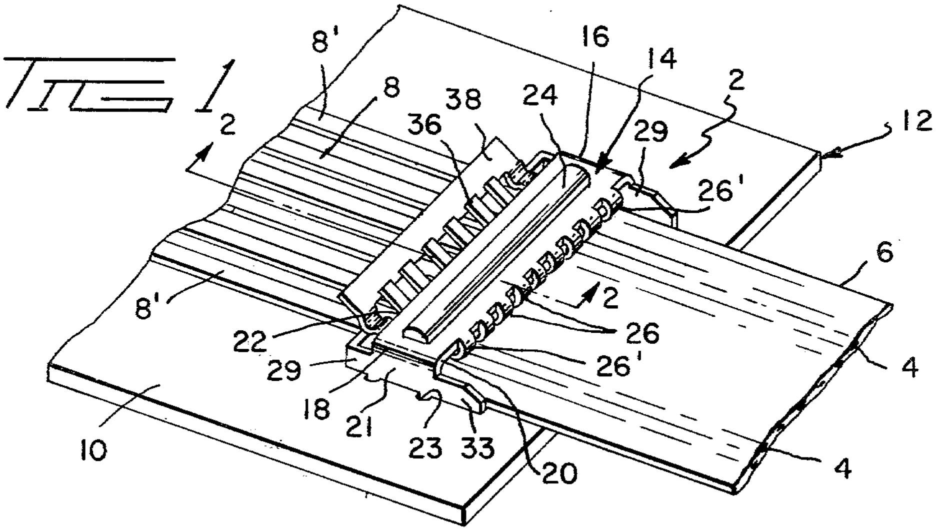
FIG. 1 is a perspective view showing a clip bar mounted on a circuit board with the end portion of a film or cable inserted between the contact springs of the connector clip and conductors on the surface of the circuit board.
Figure 2:
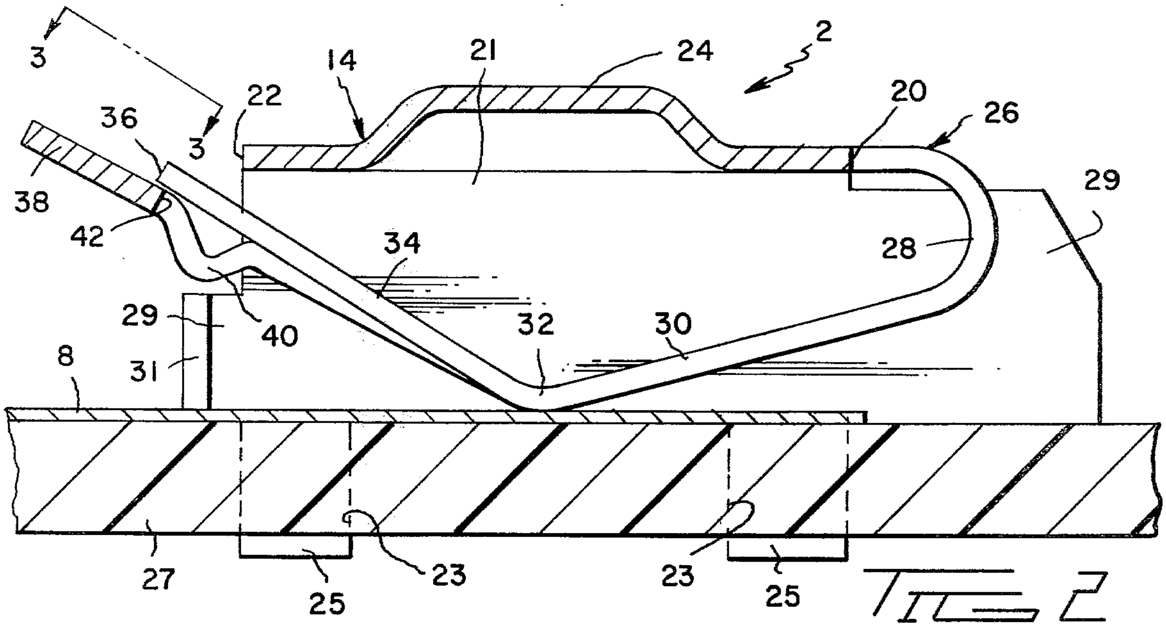
FIG. 2 is a view taken along the lines 2—2 of FIG. 1 but with the film removed.
Figure 3:
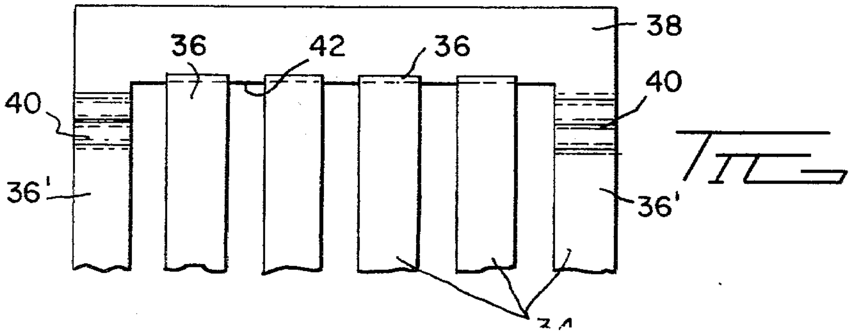
FIG. 3 is a view taken along the lines 3—3 of FIG. 2.

Referring first to FIGS. 1-3, a connector clip 2 in accordance with the invention serves to connect spaced-apart parallel conductors 4 on a film 6 to spaced-apart parallel circuit board conductors 8 on the upper side 10 of a circuit board 12. The film 6 may be a flat conductor cable as shown or may extend from a flexible circuit such as a membrane switch.

The connector clip 2 is a one-piece stamped and formed member of suitable spring material such as a spring steel. It need not have good electrical conductivity for reason that it serves to press the conductors 4 against the conductors 8 and does not carry current. The clip 2 comprises a rectangular clip bar 14 having ends 16, 18 and having first and second parallel side edges 20, 22 which extend between the ends. The clip bar 14 is embossed as shown at 24 to improve its stiffness along its entire length between the ends 16, 18.

The clip is mounted on the surface 10 by means of mounting ears 23 which extend from the side flanges 21 that support the clip bar 14 above the surface 10 of the circuit board. The ears extend through holes in the circuit board and have end portions 25 which are bent laterally as shown in FIG. 2 rigidly to secure the clip to the circuit board independently of the springs described below. The flanges 21 which extend downwardly as viewed in the drawing from the ends 16, 18 also extend rightwardly as viewed in FIG. 2 and as shown at 29 beyond the cantilever springs 26. If desired, ears can be provided on these flange extensions 29 for engagement with openings in the cable 6. Such ears may serve as strain relief means for the cable or as locating means for locating the cable on the board, although they are not always essential. The flanges 21 also have extensions 29 which project leftwardly in FIG. 2 and inwardly directed ears 31 are provided on the ends of these extensions to act as stops for the end of the cable 6. These ears 31 may be eliminated if it is desired to connect an intermediate portion of the cable to the conductors 8 and have the cable extend leftwardly beyond the clip in FIG. 1. In other words, when it is desired to use clip bars of the type disclosed for "daisy chain" connections to different circuit boards by means of a single cable.

The previously identified cantilever springs 26 extend from the first edge 20 of the clip bar and are reversely bent at 28 adjacent to edge 20. Each spring has a spring arm portion 30 which extends towards the surface 10 so that the spring bears against one of the conductors 8 on the circuit board in a contact zone 32. The springs are bent at 32, at the points of contact, and have portions 34 which extend obliquely away from the circuit board and past the second edge 22 of the clip bar. The ends 36' of the springs 26' which are immediately adjacent to the ends 16, 18 of the clip bar 14 are integral with a lifting bar 38 which extends parallel to, and which is adjacent to, the edge 22. The remaining springs 26 are severed at their ends 36 from the lifting bar 38 and the ends 36 of these remaining springs extend past the adjacent edge 42 of the lifting bar. This relationship is achieved by kinking the adjacent cantilever springs 26' as shown at 40 so that the effective lengths of these cantilever springs which are adjacent to the ends 16, 18 of the clip bar are reduced.

Figure 4:
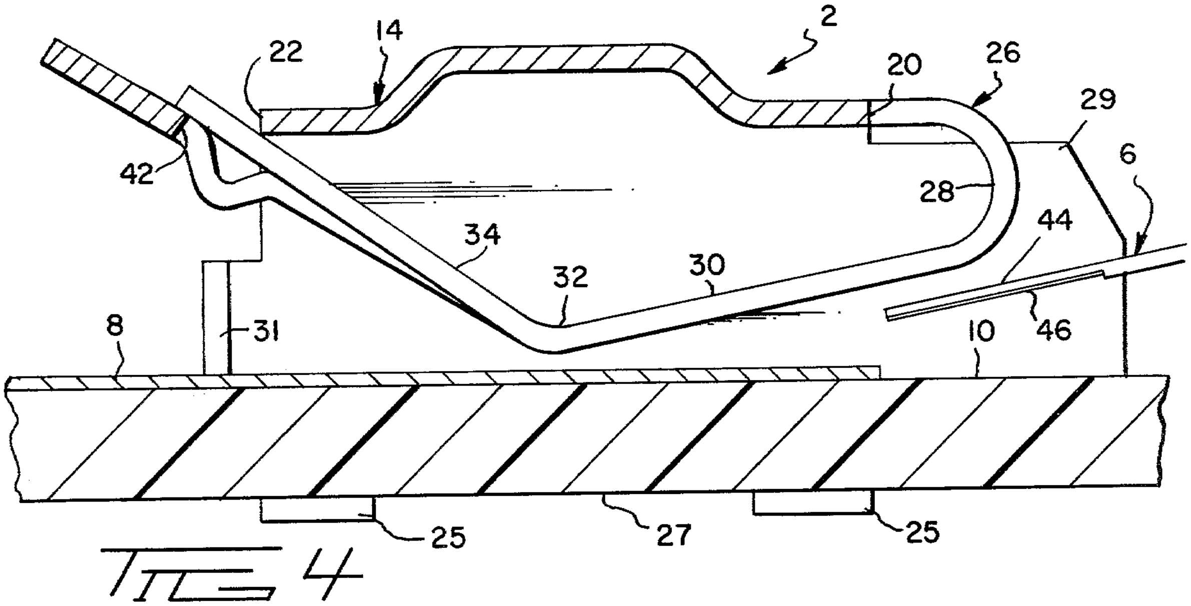
FIG. 4 is a view similar to FIG. 2 illustrating the function of the lifting bar.

When it is desired to connect conductors 4 in a cable or on a film to the conductors 8, the cable is first located adjacent to the clip bar as shown in FIG. 4 and bar 38 is pulled upwardly to the position of FIG. 4 thereby raising all of the contact areas 32 of the springs above the conductors 8. The cable is then inserted with the exposed conductors 46 at the stripped end of the cable in alignment with the conductors 8 until the cable end is against the stops 31. The lifting bar is then released and the cantilever springs will return to their normal positions and bear against the film of the cable on its upper surface. It will be apparent that it is necessary to strip the insulation from the underside of the cable 6 at only the end portion of the cable. If the conductors 4 are provided on the underside of a single film, no stripping is required.

The embodiment of the invention shown in FIGS. 1–4 is particularly advantageous when used with circuit boards having conductors 8 of non-uniform thickness on the upper surfaces 10 of the circuit boards. The conductors 8 are quite often produced by applying solder to metallized portions or bands on the surface of the circuit board, the solder being being applied by wave soldering apparatus or other means. In any event, since the solder is applied while it is molten, it sometimes happens that the conductors will not be of uniform thickness. The cantilever springs 26 are, however, independent at their ends 36 of each other (excepting the adjacent springs 26' which are integral with the clip bar) and the performance of the connector will not therefore be affected by non-uniform thicknesses in the conductors 8. In other words, if one of the conductors 8 is significantly thicker than the remaining conductors, this "high" connector will not hold the remaining contact springs elevated from the relatively low conductors 8. While the adjacent springs 26' are connected to each other by the lifting bar 38, this lifting bar is capable of flexing along its length and the adjacent contact springs 26' are therefore capable of adapting to the situation if one of the conductors 8' is relatively thicker than the other one of the conductors 8'.

Figure 5:
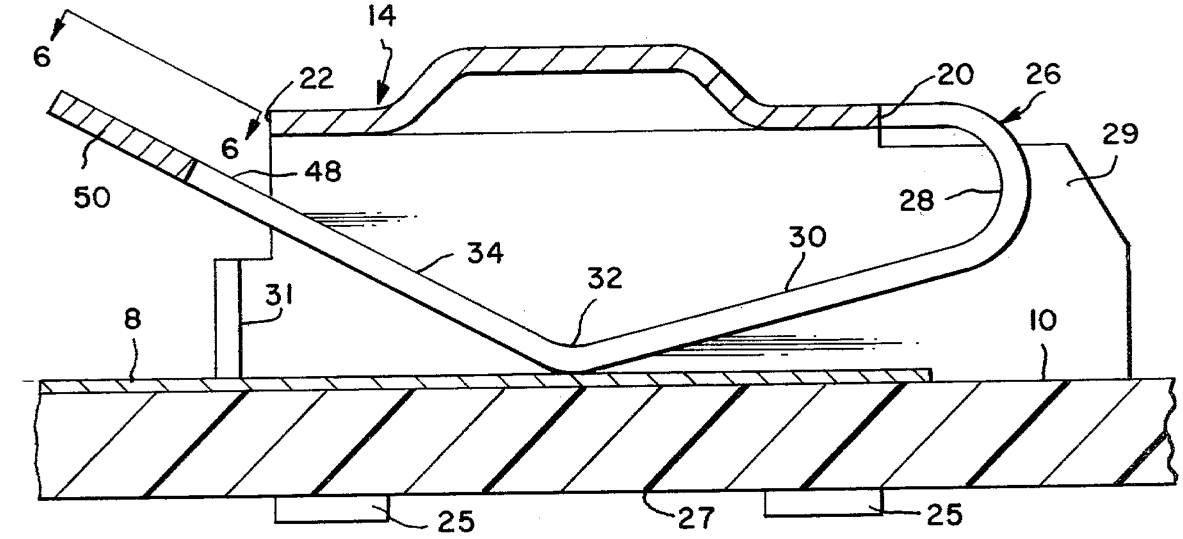
FIG. 5 is a view similar to FIG. 2 showing an alternative embodiment.
Figure 6:
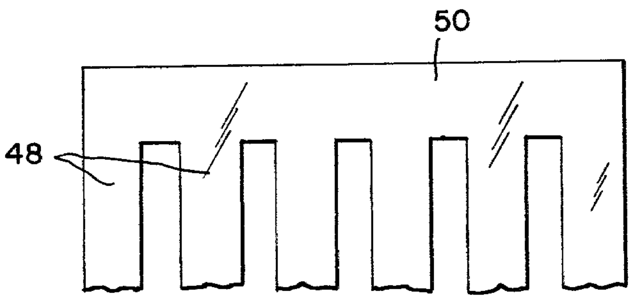
FIG. 6 is a view taken along the lines 6—6 of FIG. 5.

FIGS. 5 and 6 show an alternative embodiment in which the ends 48 of all of the cantilever springs are integral with the lifting bar 50. This embodiment will prove satisfactory if all of the conductors 8 are of the same thickness, a condition which will usually exist if the circuit board is produced by laminating copper sheet to the surface 10 and then etching the surface to leave the conductors 8 thereon.

I claim:

1. A zero insertion force electrical connector clip for connecting parallel spaced-apart film conductors on a film to parallel spaced-apart circuit board conductors on a circuit board, said clip comprising:

a one-piece stamped and formed member having a rectangular clip bar, said clip bar having ends and having first and second side edges extending between said ends, integral mounting and supporting means extending from said ends for mounting said clip on a circuit board with said clip bar spaced from, and parallel to, said circuit board and extending transversely of said circuit board conductors, a plurality of cantilever springs extending from said first side edge, each of said cantilever springs being reversely bent adjacent to said first side edge and having a spring arm portion between said mounting and supporting means, each of said cantilever springs extending from said spring arm portion oblilquely towards and beyond said second side edge, each of said cantilever springs having a free end portion which is adjacent to said second side edge, and lifting means integral with said free end portion of said cantilever spring means, said lifting means comprising a lifting bar which is integral with at least two of said cantilever springs whereby, upon mounting said clip on said circuit board in straddling relationship to said circuit board conductors on said circuit board and with said spring arm portions of said cantilever springs resiliently biased against said circuit board conductors, said cantilever springs can be raised from said circuit board by lifting said lifting means thereby to permit insertion of said film between said cantilever springs and said circuit board with zero insertion force.

2. An electrical connector clip as set forth in claim 1, said lifting bar being integral with the ends of all of said cantilever springs, said lifting bar extending adjacent to, and parallel to, said second side edge of said clip bar.

3. An electrical connector clip as set forth in claim 1, said lifting bar being integral with the ends of the cantilever springs which are immediately adjacent to said ends of said clip bar, the remaining cantilever springs being severed from said lifting bar and extending past said lifting bar whereby movement of said lifting bar causes movement of all of said cantilever springs.

4. An electrical connector clip as set forth in claim 3, said cantilever springs which are immediately adjacent to said ends of said clip bar being kinked adjacent to said second edge of said clip bar whereby said adjacent cantilever springs are shorter than the remaining cantilever springs and said remaining cantilever springs extend beyond portions of said lifting bar.

5. Electrical connecting means for electrically connecting parallel spaced-apart film conductors on a film to parallel spaced-apart circuit board conductors on one surface of a circuit board, said connecting means comprising:

a one-piece stamped and formed connector clip mounted on said circuit board, said clip comprising a rectangular clip bar having first and second side edges extending between said ends, integral mounting means extending from said ends, said clip being permanently secured to said circuit board by said mounting means, a plurality of spaced-apart cantilever springs extending from said first side edge, said springs being reversely bent adjacent to said first side edge and extending between said mouting means, said clip being located on said one surface of said circuit board in straddling relationship to said circuit board conductors with said cantilever springs in alignment with, and resiliently biased against, said circuit board conductors, said springs having end portions which extend beyond said second edge of said clip bar, and a lifting bar integral with said end portion of at least one of said springs, said lifting bar extending transversely of said end portions and being effective to lift said springs from said one surface of said circuit board when said lifting bar is moved away from said one surface whereby, upon lifting of said lifting bar away from said one surface of said circuit board, said springs are moved away from said one surface and said film can be positioned between said springs and said one surface with said film conductors in alignment with said circuit board conductors, and upon release of said lifting bar, said springs will move against said film and press said film conductors against said circuit board conductors.

6. Electrical connecting means as set forth in claim 5, said end portions of all of said cantilever springs being integral with said lifting bar.

7. Electrical connecting means as set forth in claim 5, said end portion of said cantilever springs which are immediately adjacent to said ends of said clip bar being integral with said lifting bar and the end portions of the remaining cantilever springs being severed from said lifting bar, and adjacent cantilever springs being kinked and thereby shortened, said ends of remaining cantilever springs extending past portions of said lifting bar with said lifting bar between said one surface of said circuit board and said ends of said cantilever springs.

* * * * *